United States Patent
Kroening et al.

(10) Patent No.: US 9,368,853 B2
(45) Date of Patent: Jun. 14, 2016

(54) MULTI-JUNCTION WAVEGUIDE CIRCULATOR USING DUAL CONTROL WIRES FOR MULTIPLE FERRITE ELEMENTS

(71) Applicant: Honeywell International Inc., Morristown, NJ (US)

(72) Inventors: Adam M. Kroening, Atlanta, GA (US); Sean Forney, Suwanee, GA (US)

(73) Assignee: Honeywell International Inc., Morris Plains, NJ (US)

( * ) Notice: Subject to any disclaimer, the term of this patent is extended or adjusted under 35 U.S.C. 154(b) by 120 days.

(21) Appl. No.: 14/460,723

(22) Filed: Aug. 15, 2014

(65) Prior Publication Data

US 2016/0049712 A1   Feb. 18, 2016

(51) Int. Cl.
   *H01P 1/39*    (2006.01)
   *H03H 7/38*    (2006.01)
   *H01P 5/16*    (2006.01)

(52) U.S. Cl.
   CPC .. *H01P 1/39* (2013.01); *H01P 5/16* (2013.01); *H03H 7/38* (2013.01)

(58) Field of Classification Search
   CPC ............... H01P 1/32; H01P 1/36; H01P 1/38; H01P 1/383; H01P 1/387; H01P 1/39
   USPC .................................. 333/1.1, 24.2
   See application file for complete search history.

(56) References Cited

U.S. PATENT DOCUMENTS

| | | | |
|---|---|---|---|
| 6,885,257 B2 | 4/2005 | Kroening | |
| 7,049,900 B2 | 5/2006 | Kroening | |
| 7,176,767 B2 | 2/2007 | Kroening | |
| 7,230,507 B2 | 6/2007 | Kroening | |
| 7,561,003 B2 | 7/2009 | Kroening | |
| 2003/0107447 A1 | 6/2003 | Kroening | |
| 2014/0049332 A1 | 2/2014 | Kroening | |

FOREIGN PATENT DOCUMENTS

| EP | 2698864 | 2/2014 |
|---|---|---|
| EP | 2698865 | 2/2014 |

OTHER PUBLICATIONS

European Patent Office, "Extended European Search Report from EP Application No. 15179911.1 mailed Dec. 11, 2015", from foreign counterpart of U.S. Appl. No. 14/460,723, filed Dec. 11, 2015, pp. 1-10, Published in: EP.
Mesl, "KA-Band Waveguide Ferrite Switches and Switch Matrices", "Military Microwaves Supplement", Jun. 2006, pp. 62-64.
Kroening et al, "Modular Ferrite Switch for Constructing Switch Networks", "U.S. Appl. No. 13/923,497, filed Jun. 21, 2013", pp. 1-33, Published in: US.

*Primary Examiner* — Stephen E Jones
(74) *Attorney, Agent, or Firm* — Fogg & Powers LLC (57) ABSTRACT

In at least one embodiment, a circulator module comprises circulators. Each circulator comprises: an internal cavity; ports extending from the internal cavity wherein at least one port connects the circulator to another circulator; and a ferrite element disposed in the internal cavity, the ferrite element including an aperture. The circulator module further comprises a first control wire, wherein a first portion of the first control wire is disposed in an aperture of the ferrite element of the first circulator and wherein a second portion of the first control wire is disposed in an aperture of the ferrite element of the second circulator; and, a second control wire, wherein a first portion of the second control wire is disposed in an aperture of the ferrite element of the first circulator and wherein the second control wire is not disposed in an aperture of the ferrite element of the second circulator.

20 Claims, 11 Drawing Sheets

MULTI-JUNCTION WAVEGUIDE CIRCULATOR USING DUAL CONTROL WIRES FOR MULTIPLE FERRITE ELEMENTS

BACKGROUND

In some communication networks, certain communication nodes in the network are not easily accessible for repairs in the event that equipment on the communication node experiences a failure. For example, communication nodes located in space are practically inaccessible and, as such, that failed equipment cannot be repaired. To prevent the failures from affecting the operation of the communication node, the communication equipment on the communication node includes standby equipment that increases the redundancy of any communication paths through the communication equipment. To control which communication paths are used through the communication equipment, a switch network is used to switch a communication path from failed equipment to standby equipment.

In certain implementations, a switch network can be implemented using a network of switching circulators. To switch the direction of the switching circulators, control wires magnetize the ferrite elements contained in the circulators to switch the direction of the RF signals travelling through the switching circulator. In conventional implementations, each ferrite element that may need to be switched has a single control wire wound through the ferrite element. In these implementations, a single driver circuit must provide the flow of current in both directions in the single control wire, which enables the circulator to switch for clockwise or counter-clockwise flow of RF signals through the circulator.

SUMMARY

The Embodiments of the present disclosure provide systems and methods of multi junction waveguide circulators using dual control wires for multiple ferrite elements.

In at least one embodiment, a circulator module comprises: a plurality of circulators including a first circulator and a second circulator. Each circulator in the plurality of circulators comprises: an internal cavity; a plurality of ports extending from the internal cavity wherein at least one port in the plurality of ports connects the circulator to another circulator; and at least one ferrite element disposed in the internal cavity, the at least one ferrite element including at least one aperture. The circulator module further comprises a first control wire, wherein a first portion of the first control wire is disposed in a respective aperture of the at least one ferrite element of the first circulator and wherein a second portion of the first control wire is disposed in a respective aperture of the at least one ferrite element of the second circulator. The circulator module also comprises a second control wire, wherein a first portion of the second control wire is disposed in a respective aperture of the at least one ferrite element of the first circulator and wherein the second control wire is not disposed in a respective aperture of the at least one ferrite element of the second circulator.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

As mentioned above, in conventional implementations, each ferrite element that may need to be switched has a single control wire wound through the ferrite element, which is controlled by a single driver circuit that enables the flow of current in both directions in the single control wire. However, using a single control wire requires a more complicated driver circuit. The embodiments in this disclosure provide a solution to this problem.

Moreover, in many conventional implementations, each ferrite element has a respective control wire. Including a control wire for each ferrite element can require more apertures to be made in the conductive waveguide walls of the circulator when routing the control wires to their respective drivers. This can result in degraded performance of the circulator due to interference, impedance matching problems, RF leakage, etc. The embodiments in this disclosure provide a solution to this problem as well.

Figure 1:
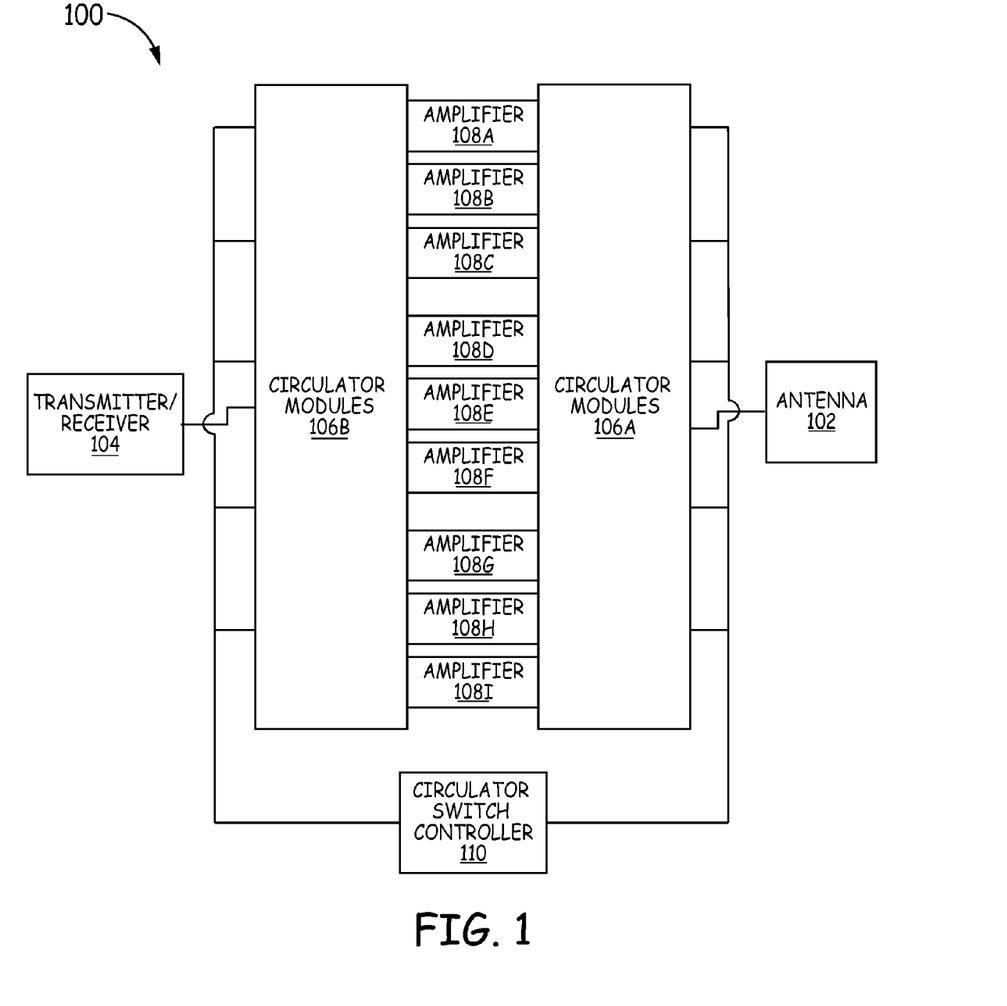
FIG. 1 is a block diagram of an example system that implements redundancy networks using circulator modules.

FIG. 1 is a block diagram of an example system 100 that implements redundancy networks using circulator modules 106A, 106B. In one implementation, system 100 is part of a communication node that transmits and receives signals. For example, the system 100 receives one or more signals through an antenna 102. A signal in the one or more signals is routed to a respective one of the amplifiers 108A-108I by the circulator modules 106A, amplified by the respective amplifier 108A-108I, routed to a transmitter/receiver 104 by another group of circulator modules 106B and then processed by the transmitter/receiver 104. In at least one implementation the amplifiers 108A-108I may be low noise amplifiers, power amplifiers, travelling wave tube amplifiers, or the like. Also, in certain implementations, the transmitter/receiver 104 provides a signal to the circulator modules 106B that is amplified by a respective one of the amplifiers 108A-108I and then provided to the antenna 102 by the other group of circulator modules 106A for radiation to another communication node in the communication network.

In certain embodiments, the system 100 is implemented on a platform that is inaccessible for repairs when a component on the system experiences a fault. For example, the system 100 may be implemented on a satellite located in space or other inaccessible location. In at least one embodiment, one of the amplifiers 108A-108I in the system 100 may experience a failure during the life of the system 100. To prevent the failure from negatively affecting the operation of the system 100, when the system 100 begins operation, the system 100 may include multiple amplifiers 108A-108I, where a portion of the amplifiers 108A-108I function as standby amplifiers in the event that an operating amplifier fails. When an operating amplifier fails, circulator modules 106A, 106B change the communication path that passes through the failed amplifier to another communication path that passes through a standby amplifier. For example, assume a signal is originally routed through amplifier 108A; however, after a certain amount of time, the amplifier 108A fails. At this time, the signal can be rerouted through amplifier 108B instead of being routed through amplifier 108A. As a result, the system does not need to be taken out of service and repaired due to the failure of amplifier 108A.

The amplifiers 108A-108I in FIG. 1 are used as examples of electronic components. However, while amplifiers 108 are used as an example, the amplifiers 108 can be replaced by other electronic components that may need to be implemented in a redundancy network.

The circulator modules 106A, 106B are a modular network of circulators that can be interconnected with one another to create a switching network. In at least one embodiment, the circulator modules 106A, 106B are connected to one another to provide switching capabilities between a number of module inputs and module outputs when a ferrite element included in a circulator module is magnetized. An exemplary circulator module and exemplary ferrite elements that are included in the circulator modules 106A, 106B are explained in more detail below in FIG. 2.

In certain embodiments, to control the direction of a circulator in the circulator modules 106, the system 100 includes a circulator switch controller 110. The circulator switch controller 110 sends electrical signals to the individual circulators via one or more control wires that control the magnetization of the one or more ferrite elements included in each circulator. The magnetization of the ferrite element included in the circulator determines the direction of circulation for the circulator. Exemplary configurations of the one or more control wires are explained in more detail below in FIGS. 4A-5C.

In certain implementations, the circulator switch controller 110 includes a separate driver that is associated with an individual circulator in the circulator modules 106, wherein the driver provides a switching signal to the individual circulator. Further, in some implementations, the circulator switch controller 110 can include two drivers for each circulator that needs to route RF signals in two directions in the circulator modules 106, one for each direction of circulation of the individual circulator.

Figure 2:
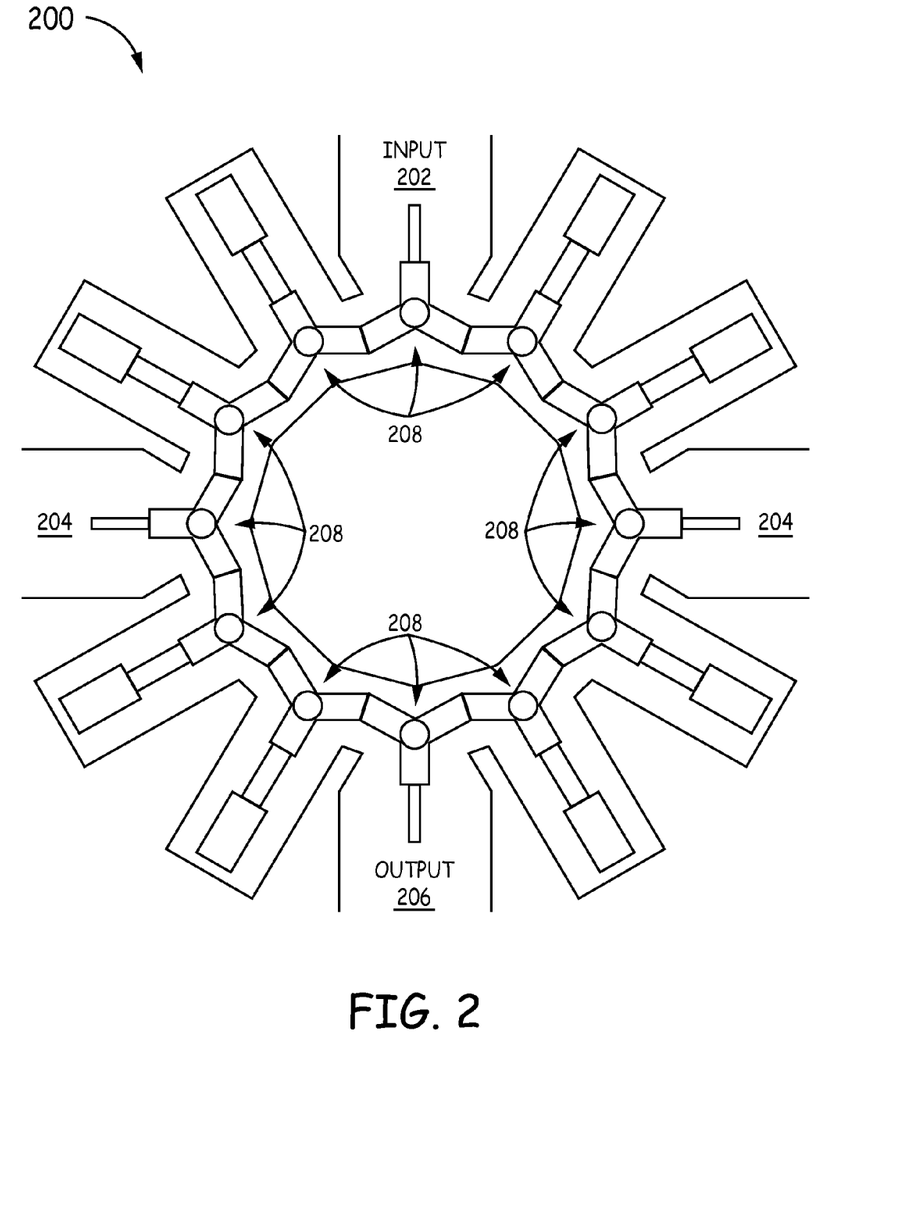
FIG. 2 is a diagram of an example circulator module that can be included in the circulator modules of FIG. 1.

FIG. 2 is a diagram of an example circulator module 200 that can be included in the circulator modules 106 of FIG. 1. As stated above, one or more circulator modules 200 can be included in the circulator modules 106 of FIG. 1. Generally, the circulator module 200 receives an RF signal at its input 202. Then, depending on the directionality of the circulators 208, the RF signal can be directed to an interconnection port 204 or to the circulator module's output 206. To accomplish this, the circulator module 200 includes a plurality of circulators 208 which are used to direct an RF signal propagating within the circulator module 200. While the circulator module 200 in FIG. 2 includes twelve circulators 208, more or less circulators 208 can be included in a circulator module in other embodiments. In at least one embodiment, eight circulators 208 will be used in the circulator module 200. Moreover, the circulator module 200 includes control wires (not shown). The control wires and some exemplary configurations of the control wires are discussed in FIGS. 4A-5C below. A more detailed discussion about exemplary circulator 208 configurations and how the circulators can be coupled together to ensure impedance matching can be found in U.S. Pat. Nos. 6,885,257, 7,049,900, 7,176,767, 7,230,507 and 7,561,003 and are incorporated herein by reference.

Figure 3A:
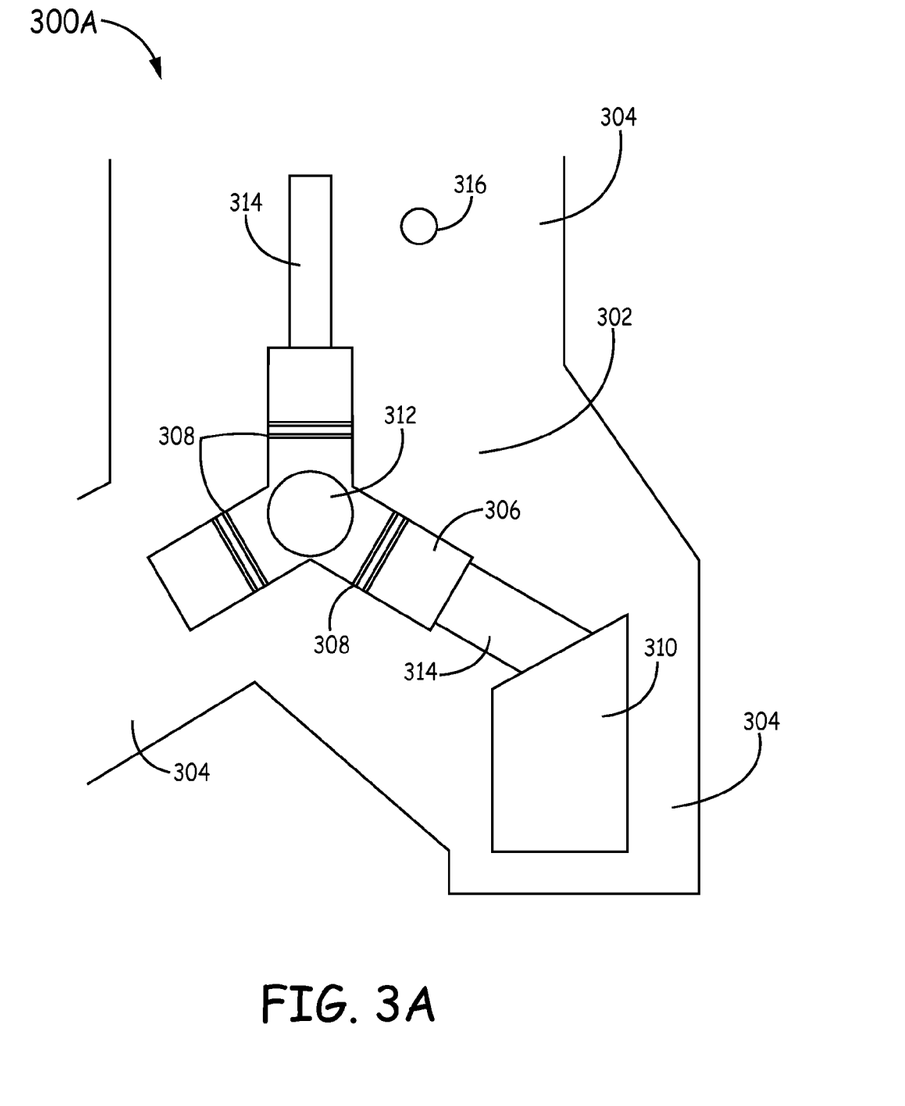
FIGS. 3A-3B are a diagrams of example circulators that can be used in the circulator module of FIG. 2.

FIG. 3A is a diagram of one embodiment of an exemplary circulator 300A that can be used in the circulator module 200 of FIG. 2. The circulator 300A includes an internal cavity 302 and a plurality of ports 304 extending from the internal cavity 302. The internal cavity 302 and the ports 304 result in a conductive waveguide structure for directing RF signals from one port 304 to another port 304. Moreover, at least one port 304 in the plurality of ports 304 is connected to another circulator 300A (not shown) so that the RF signal can be directed through the circulators 208 in a circulator module 200 from an input 202, to an interconnection port 204, or to an output 206.

The circulator 300A includes at least one ferrite element 306 disposed in the internal cavity 302. The at least one ferrite element 306 can be magnetized using a control wire (not shown, but discussed in more detail in FIGS. 4A-5C). When a magnetizing field is created in the ferrite element 306, a gyromagnetic effect can be used to switch the RF signal from one port 304 to another port 304. By reversing the direction of the magnetizing field, the direction of switching between the ports 304 is reversed. As a result, RF energy can be routed with low insertion loss from one port 304 to either of the two other ports 304. Thus, a switching circulator 300A is functionally equivalent to a fixed-bias circulator but has a selectable direction of circulation. In some embodiments, if one of the ports 304 is terminated in a matched load 310, then the circulator 300 acts as an isolator, with high loss in one direction of propagation and low loss in the other direction. The ferrite elements 306 and load elements 310 can be connected in various configurations according to the modular design of the circulator modules 106. Reversing the direction of the magnetizing field will reverse the direction of high and low isolation.

While the ferrite element 306 is shown to be have a Y-shape, other shapes can be used as well. For example, a triangular puck or a rectangular puck can be used as well. Moreover, there can be more than one ferrite element 306 disposed in the internal cavity 302 of the circulator 300. These are only examples and not meant to be limiting.

Also, in some embodiments, the circulators 300 can include dielectric spacers 312, quarter-wave dielectric ferrite-to-air transformers 314, and/or matching elements 316. The dielectric spacers 312 can be used to: center the ferrite elements 306 along the height of the internal cavity 302, aid in the transfer of heat out of the ferrite elements 306 in the case of high power designs, and/or reduce the insertion loss of the circulator 300. In some embodiments, the quarter-wave dielectric ferrite-to-air transformers 314 can be used to transition from the ferrite element 306 to the input ports 202/output ports 206 shown in FIG. 2. In some other embodiments, as shown in FIG. 3, a quarter-wave dielectric ferrite-to-air transformer 314 can also be used to transition to a matched load 310. Further, the matching elements 316 can be disposed on the surface of the circulator 300 to affect the performance of the circulator 300. In particular, the matching elements 316 can be capacitive/inductive dielectric or metallic buttons that are used to empirically improve the impedance match over the desired frequency band. Each matching element 316 can be disposed adjacent to a quarter-wave dielectric ferrite-to-air transformer 314 in some embodiments.

The control wire used to magnetize the ferrite element 306, as discussed above, is disposed in at least one aperture 308 that is included in the ferrite element 306. Then, when a high current pulse passes through the control wire, the ferrite element 306 is magnetized and the directionality of the circulator 300 can either be reinforced or the directionality of the circulator 300 can change, depending on the direction of the high current pulse in the control wire. While three apertures 308 are shown in FIG. 3, more or less apertures 308 can be included in the ferrite element 306. Furthermore, a control wire can be disposed in only one of the apertures 308 or more than one of the apertures 308, including being disposed in all the apertures 308.

Figure 3B:
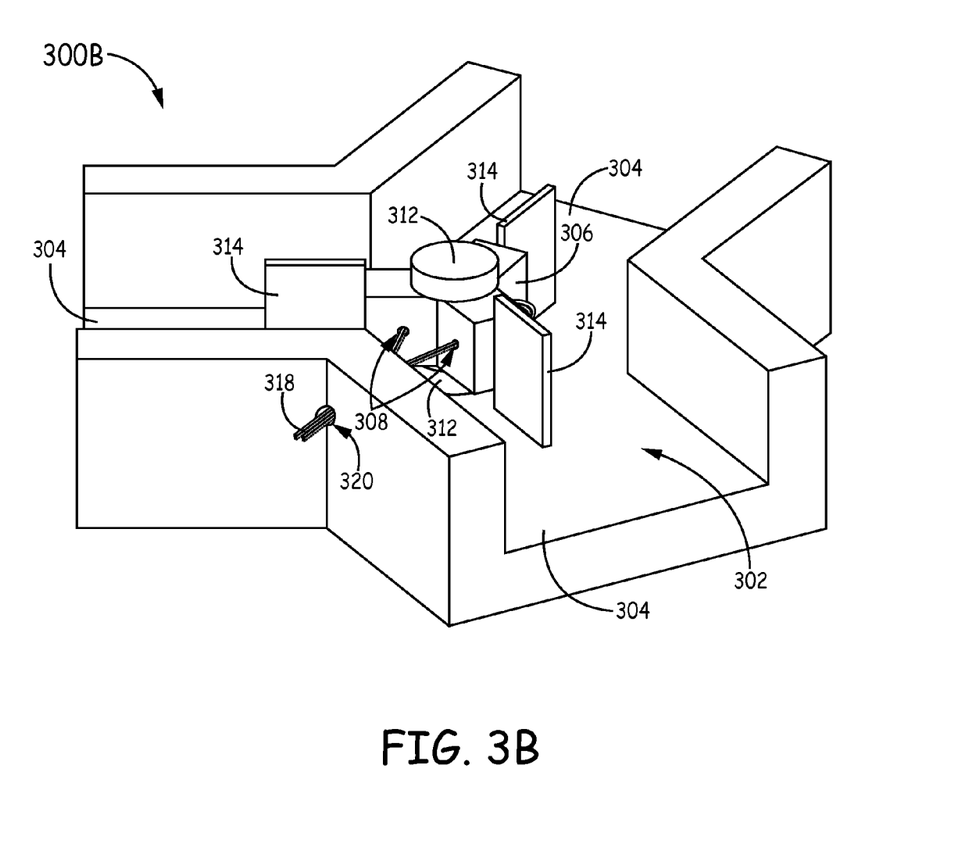

FIG. 3B is a diagram of another embodiment of an exemplary circulator 300B that can be used in the circulator module 200 of FIG. 2. In this diagram, matched loads (310 in FIG. 3A) and matching elements (316 in FIG. 3A) are not included. However, control wires 318 are included in FIG. 3B. While two control wires 318 are shown in the diagram, less control wires 318 may be included in each circulator 300B as discussed in more detail below. As can be seen in the diagram, the control wires 318 exit the conductive waveguide walls from apertures 320 in the conductive waveguide walls. One advantage of the control wiring 318 configurations discussed in FIGS. 4A-5C is that the apertures 320 in the conductive waveguide walls and/or the size of the apertures 320 in the conductive waveguide walls can be decreased by the configurations in FIGS. 4A-5C as discussed below.

Figure 4A:
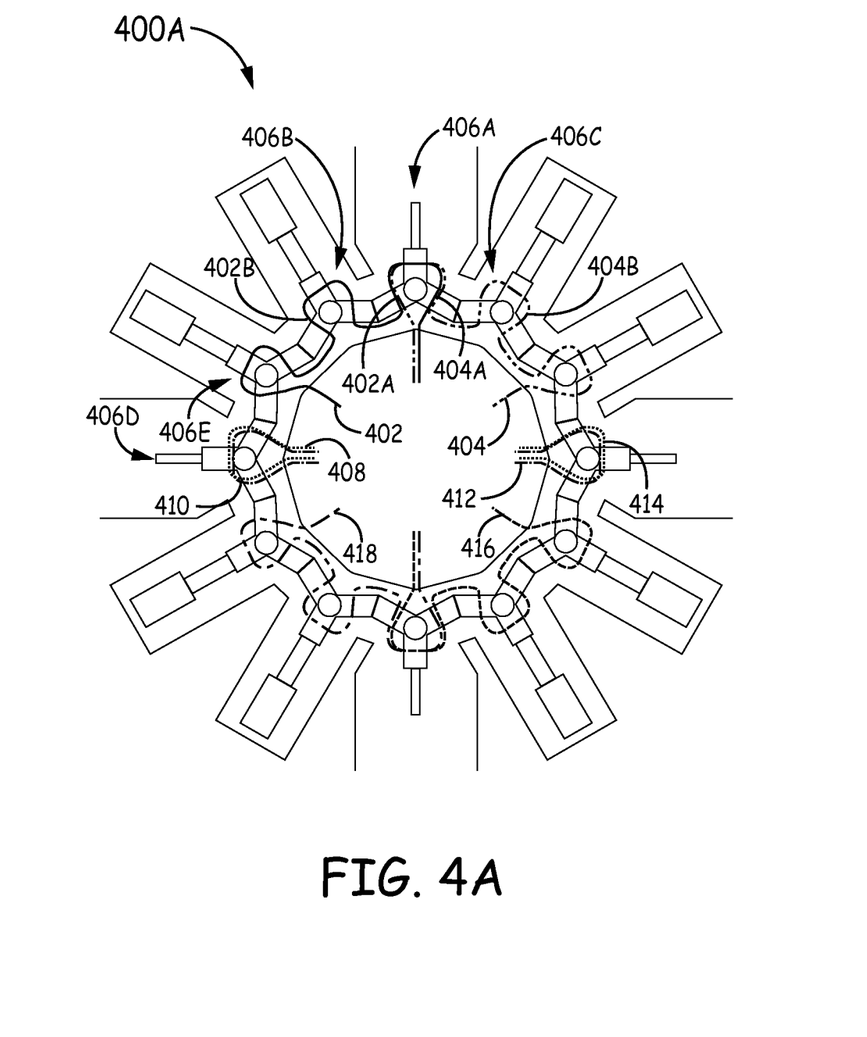
FIGS. 4A-4C show different control wiring configurations for a single circulator module.
Figure 4B:
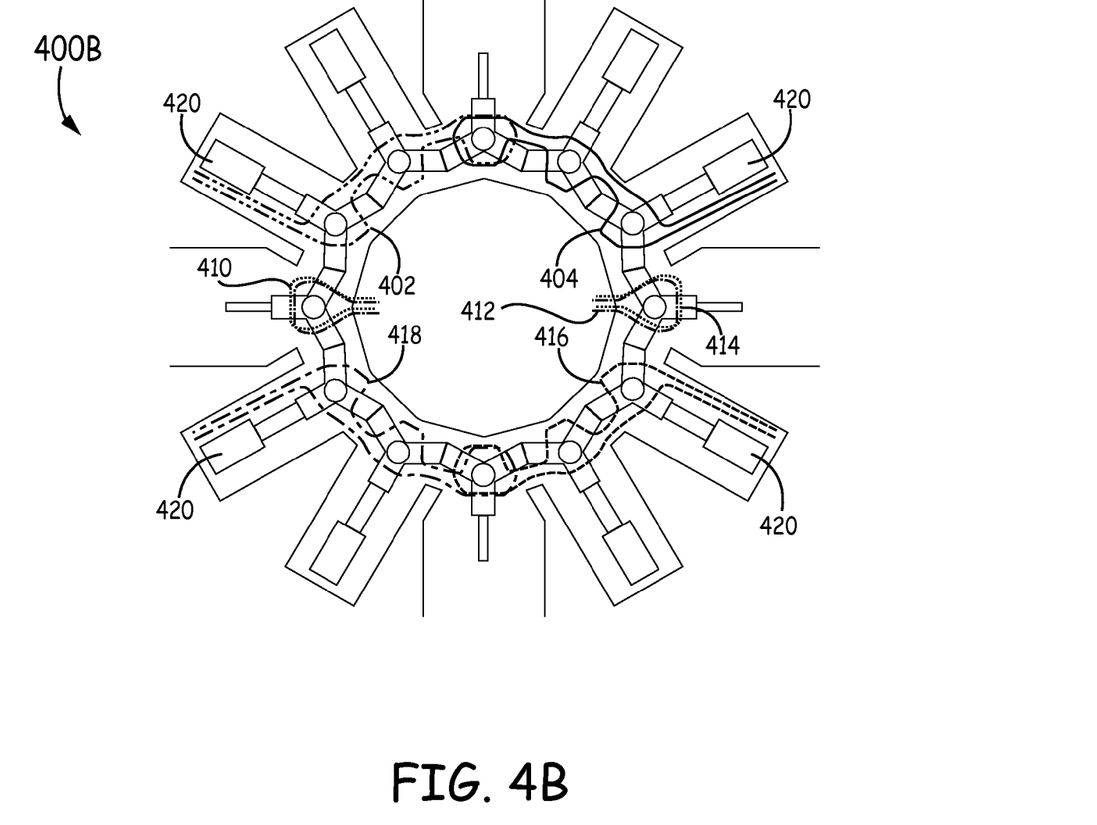
Figure 4C:
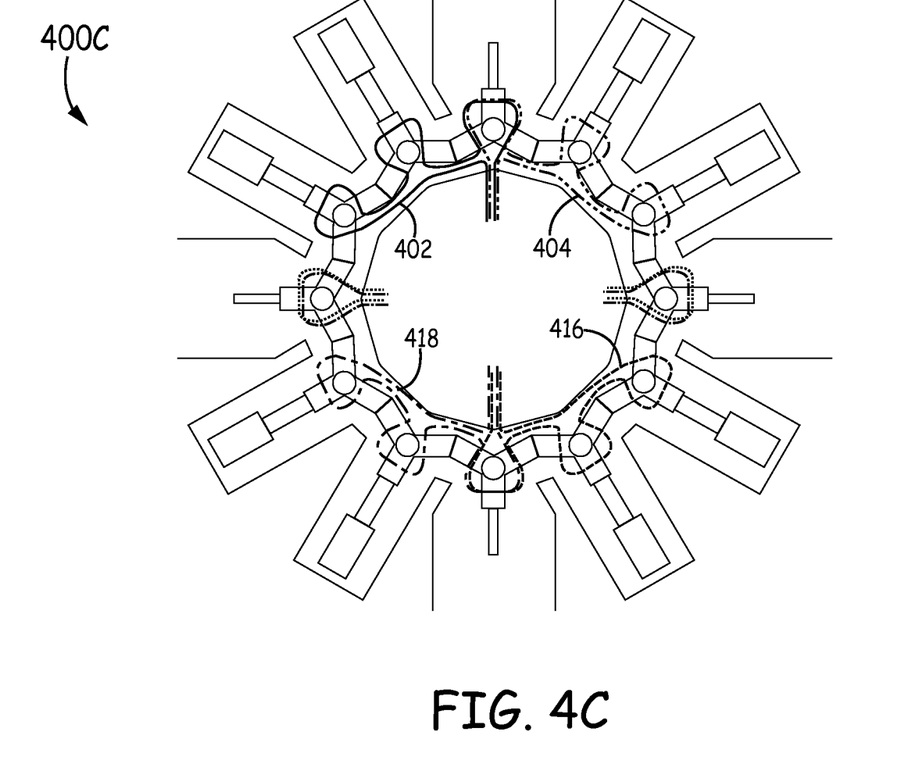

FIGS. 4A-4C show embodiments of exemplary control wiring configurations for a single circulator module 400A, 400B, 400C. Note that although the circulator modules 400A-400C are shown with twelve circulators, more or less circulators can be used in other embodiments. For example, in some exemplary embodiments, eight circulators are used.

As shown in FIG. 4A, a circulator module 400A includes a first control wire 402 and a second control wire 404. The first control wire 402 includes a first portion 402A that is disposed in an aperture of the ferrite element that is included in a first circulator 406A. Furthermore, a second portion 402B of the first control wire 402 is disposed in an aperture of the ferrite element that is included in a second circulator 406B. When a current pulse passes through the first control wire 402, the ferrite elements that the first control wire 402 is disposed in will magnetize. This will control the direction of an RF signal travelling through the circulators 406A, 406B. More specifically, when a current pulse passes through the first control wire 402 so that the direction of electron flow through the control wire is in the counter-clockwise direction through circulators 406A, 406B, RF energy travelling through the circulator 406A will be directed in a clockwise direction to the third circulator 406C.

Furthermore, as shown in FIG. 4A, a first portion 404A of a second control wire 404 is disposed in an aperture of the ferrite element of the first circulator 406A. Similar to above, a current pulse that passes through the second control wire 404 with electron flow in a clockwise direction will magnetize the ferrite element that the control wire 404 is disposed in and direct RF energy travelling through the first circulator 406A in a clockwise direction to the second circulator 406B.

To determine whether more than one wire needs to be disposed in a respective aperture of a circulator, it can be useful to figure out how many different directions an RF signal may need to be directed to in the circulator. If an RF signal only needs to traverse in one direction like clockwise in the second circulator 406B (and counter-clockwise in the third circulator 406C discussed below), then only one control wire may need to be placed in an aperture of the circulator. However, if an RF signal needs to traverse in more than one direction, like the first circulator 406A, then more than one control wire may need to be displaced in an aperture of the circulator.

In some embodiments, the circulator module 400A can include a third circulator 406C. In these embodiments, a second portion 404B of the second control wire 404 can be disposed in an aperture of the ferrite element of the third circulator 406C. Similar to above, only one control wire needs to be displaced in an aperture of the ferrite element of the third circulator 406C because due to the configuration of the circulators 406A-406C in the circulator module 400, the third circulator 406C only needs to direct the RF energy in one direction.

The control wire 402, 404 configuration shown in FIG. 4A has advantages over conventional implementations because the drivers that provide the current pulses do not need to provide a pulse in both directions since a first control wire 402 is used to magnetize the ferrite element in the first circulator 406A in one direction; and, a second control wire 404 is used to magnetize the ferrite element in the first circulator 406A in the opposite direction. Moreover, by having a first control wire 402 magnetize a ferrite element in more than one circulator (e.g., circulators 406A, 406B, 406E), the number of apertures and/or size of the apertures in the conductive waveguide walls of the circulator 400A where the control wires exit the circulator 400A can be reduced. This helps reduce the RF interference that may take place in the circulator 400A from more or larger holes.

In some embodiments, the circulator module 400A can include a fourth circulator 406D. In some embodiments, the fourth circulator 406D can be wired using a third control wire 408 and a fourth control wire 410. As can be seen in FIG. 4A, the fourth circulator 406D may need to transmit incoming RF signals in two different directions. Therefore, the fourth circulator 406D will need two different control wires 408, 410 for the two different directions.

As shown in FIG. 4A, in some implementations, there can more than four control wires 402, 404, 408, 410 for the other circulators located in the circulator module. For example, a fifth control wire 412, a sixth control wire 414, a seventh control wire 416 and an eighth control wire 418 are shown in FIG. 4A. These control wires 412-418 function similar to the control wires discussed above 402, 404, 408, 410, except that they are disposed in aperture of the ferrite elements of their respective circulators. Moreover, a single control wire can be disposed in an aperture of the ferrite element included in a circulator if the circulator only needs to direct the RF energy in one direction. If the RF energy needs to be directed in more than one direction, two control wires can be disposed in the aperture of the ferrite element included in the respective circulator. The first circulator 406A, the second circulator 406B, the third circulator 406C and the fourth circulator 406D can be chosen similarly. That is, the first circulator 406A and the fourth circulator 406D can be circulators in the circulator module 400A need to direct RF signals in more than one direction and therefore, need two control wires. Whereas the second circulator 406B and the third circulator 406C can be circulators in the circulator module 400A that need to only direct RF energy in one direction.

FIG. 4B is another example of a wiring configuration for the circulator module 400B. The wiring of the control wires 402-418 in FIG. 4B accomplish the same result as the wiring configuration in FIG. 4A, except, the first control wire 402, the second control wire 404, the seventh control wire 416, and the eighth control wire 418 exit and enter the circulator module 400B in different locations than the previous circulator module 400A. This implementation can be used so that the holes where the control wires exit do not all have to be in the center of the circulator module 400B, as they were in the circulator module 400A. Instead, the control wires 402, 404, 416, 418 exit the circulator module 400B near the loads 420. In some embodiments, the control wires 402, 404, 416, 418 can be wound through the loads 420 for RF absorption.

FIG. 4C is another example of a wiring configuration for the circulator module 400C. However, in this example, the number of holes in the center of the circulator module 400C can be reduced since all the ends of the control wires 402, 404, 416, 418 are routed together. This implementation can be useful if there is not a lot of space in the middle of a circulator module, which may occur if a circulator module has less than 12 circulators.

Figure 5A:
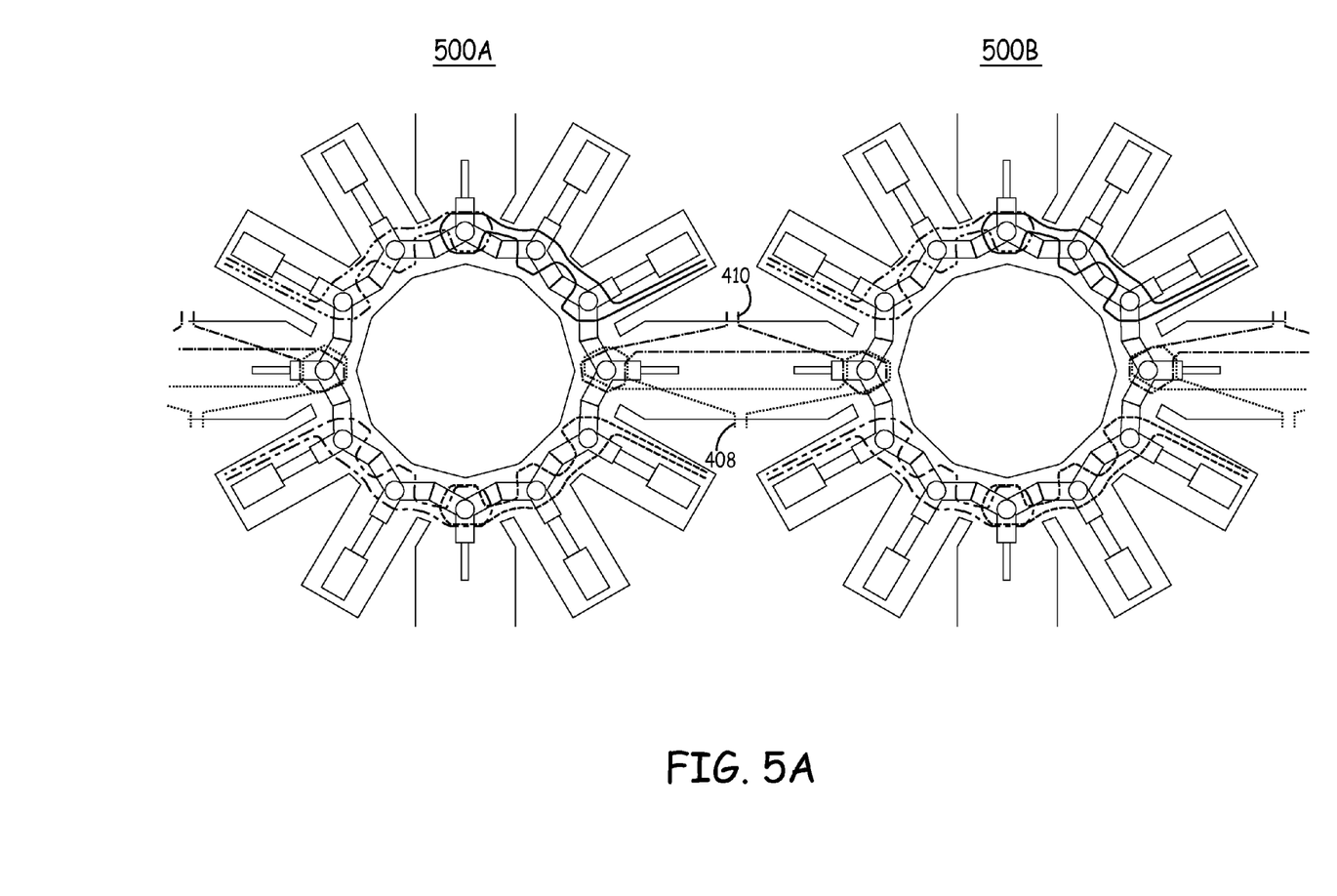
FIGS. 5A-5C are examples of wiring configurations for more than one circulator module.
Figure 5B:
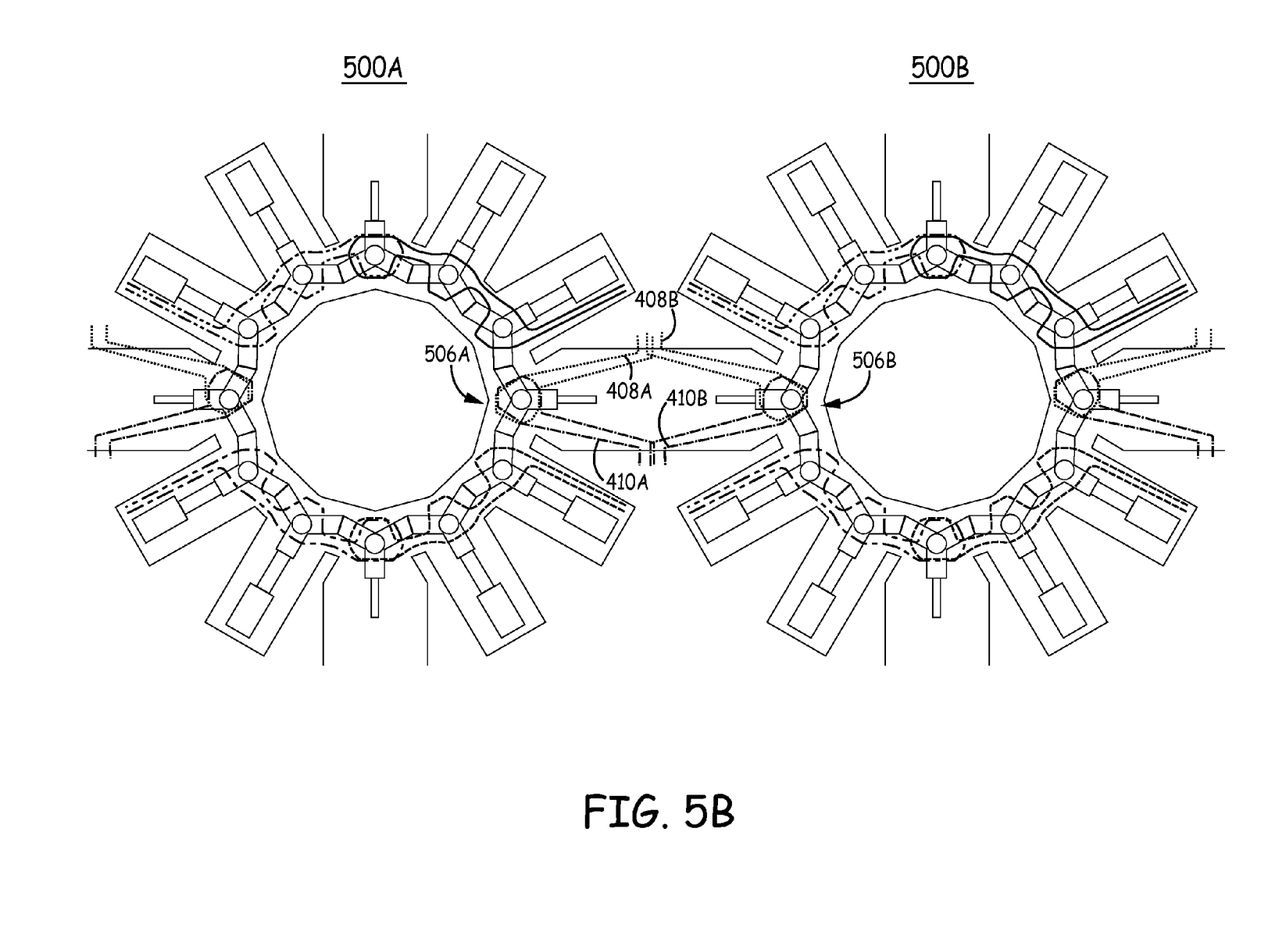
Figure 5C:
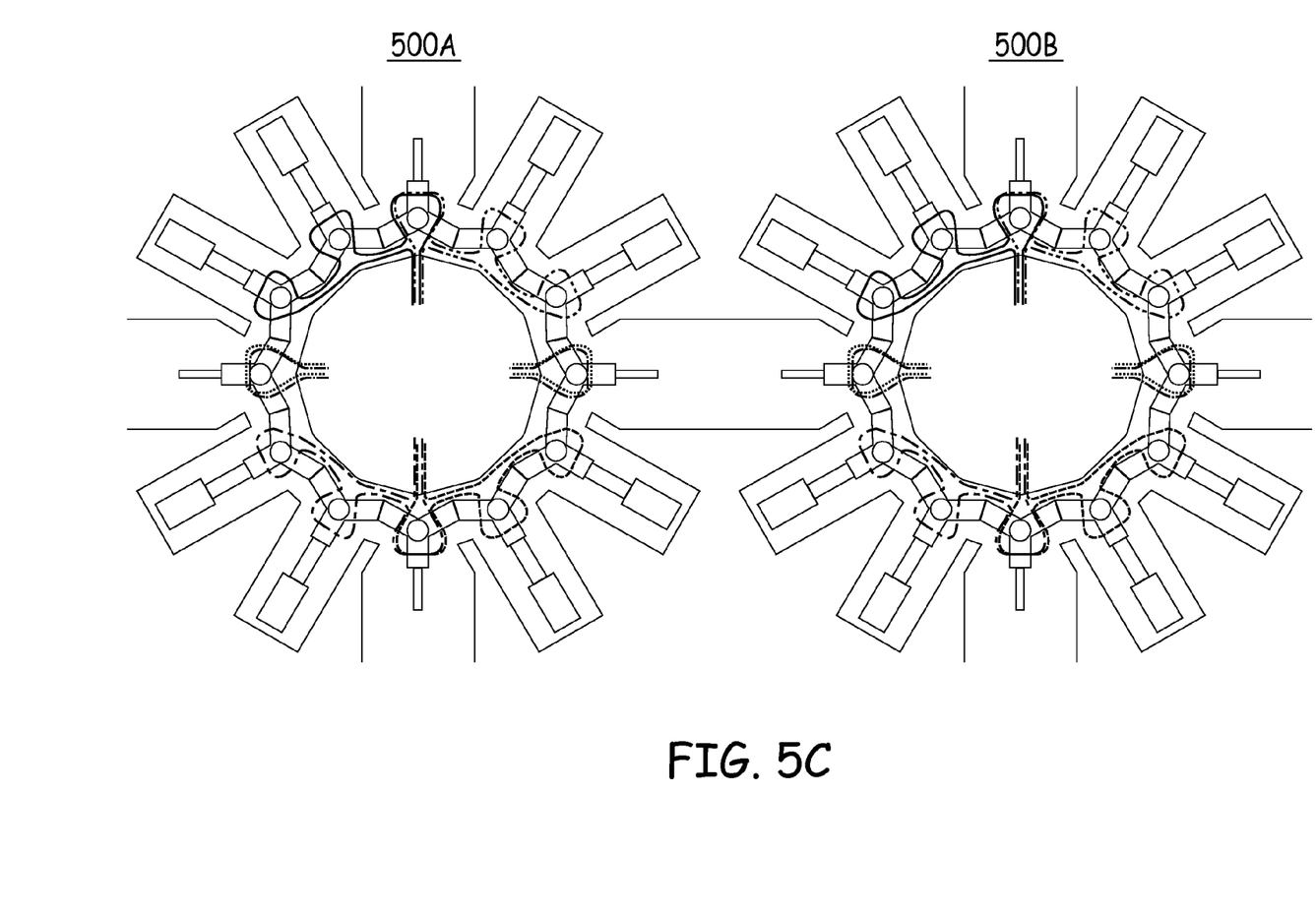

FIGS. 5A-5C are examples of wiring configurations for more than one circulator module 500A, 500B. FIG. 5A is an example of a wiring configuration that shares the third control wire 408 and the fourth control wire 410 between two circulator modules 500A, 500B. This can be useful since the number of holes made in the circulator modules 500A, 500B can possibly be reduced.

FIG. 5B is another possible wiring configuration for the control wires. Here, the circulators 506A, 506B each have their own control wires 408A, 410A and 408B, 410B, respectively. However, the holes in the circulator modules can be reduced due to the configuration of the control wires 408A, 408B, 410A, 410B. That is, even though there are four control wires 408A, 408B, 410A, 410B, only two holes are needed since the ends of the four control wires 408A, 408B, 410A, 410B are routed together.

Moreover, in some embodiments, the control wires from each circulator modulator 500A, 500B can use the same hole, i.e., a single hole for each pair of control wires, as shown in FIG. 5C. This implementation can be useful if there is ample space in the middle of the circulator modules 500A, 500B.

Figure 6:
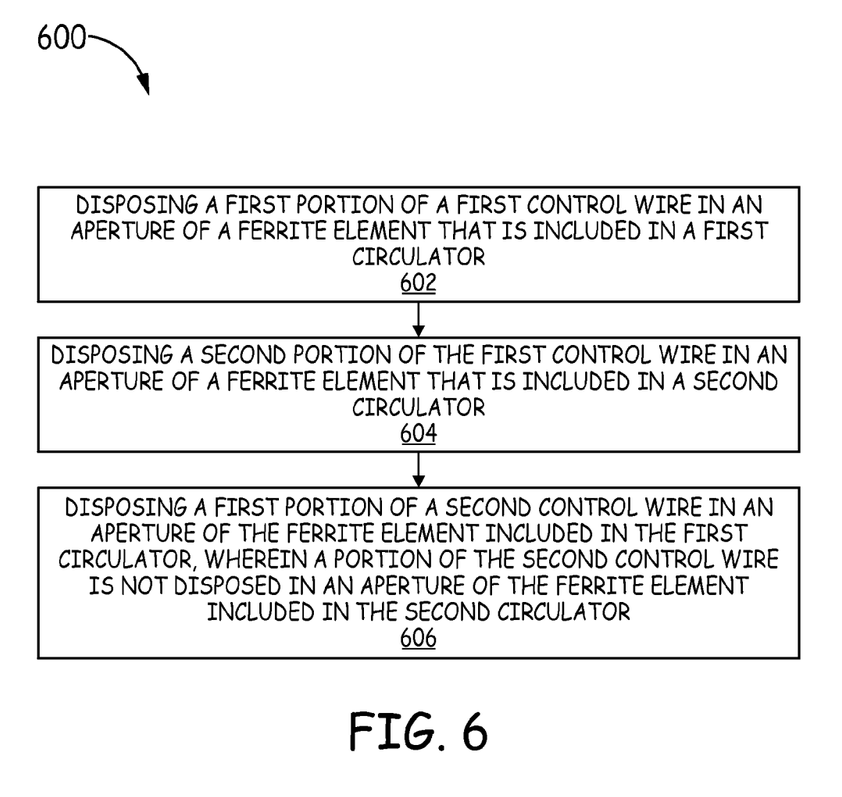
FIG. 6 is a flow diagram of an example method for wiring a circulator module.

FIG. 6 is a flow diagram of an example method 600 for wiring a circulator module. The method includes disposing a first portion of a first control wire in an aperture of a ferrite element that is included in a first circulator (block 602). In some embodiments, the first control wire, the aperture, the ferrite element and the first circulator can have some or all of the same characteristics as the first control wire 402, the aperture 308, the ferrite element 306 and the first circulator 406A that were discussed above. For example, the ferrite element can include one or more ferrite elements that include one or more apertures, which are disposed in the internal cavity of the first circulator. The circulator can have a plurality of ports that extend from the internal cavity, wherein at least one port connects the circulator to another circulator. When a high current pulse passes through the first control wire, the ferrite element that the first control wire is disposed in will magnetize and the magnetization will control the direction of an RF signal that enters the first circulator.

The method 600 further comprises disposing a second portion of the first control wire in an aperture of a ferrite element that is included in a second circulator (block 604). In some embodiments, the second portion of the first control wire and the second circulator can have some or all of the same characteristics as the second portion 402B of the first control wire 402 and the second circulator 406B have above. For example, the second circulator only needs to direct an RF signal in one direction. Therefore, only one control wire needs to be disposed in the ferrite element of the circulator.

The method 600 also includes disposing a first portion of a second control wire in an aperture of the ferrite element included in the first circulator, wherein a portion of the second control wire is not disposed in an aperture of the ferrite element included in the second circulator (block 606). Similar to above, the second control wire can have some or all of the same characteristics as the second control wire 404 discussed above. Namely, when a current pulse passes through the second control wire, the ferrite element which the second control wire is disposed in will magnetize and direct an RF signal that travels through the circulator in a direction opposite than the RF signal would have traveled had a current pulse passed through the first control wire.

In some embodiments, method 600 can further comprise disposing a second portion of the second control wire in an aperture of a ferrite element that is included in a third circulator. Similar to above, the third circulator can have some or all of the same characteristics as the third circulator 406C discussed above. That is, the third circulator may only need to direct an RF signal in one direction and therefore, only require a single control wire.

Method 600 may also comprise disposing a portion of a third control wire in an aperture of a ferrite element that is included in a fourth circulator and disposing a fourth control wire in the aperture of the ferrite element included in the fourth circulator. In these embodiments, the fourth circulator may need to be able to direct RF signals in more than one direction. As a result, two control wires, i.e., the third control wire and the fourth control wire, each control the direction of an RF signal in one direction, respectively.

In some of these embodiments, method 600 may also include coupling the first control wire and the second control wire to at least one driver, wherein the at least one driver is configured to provide a current pulse to the first control wire or the second control wire or both. The drivers that the control wires are coupled to can have some or all of the same characteristics as the drivers discussed above. For example, each driver only needs to provide a pulse in one direction since there are two control wires disposed in a ferrite element of a circulator that needs to direct RF energy in more than one direction. This helps simplify the design of the drivers.

EXAMPLE EMBODIMENTS

Example 1 includes a circulator module comprising: a plurality of circulators including a first circulator and a second circulator, wherein each circulator in the plurality of circulators comprises: an internal cavity; a plurality of ports extending from the internal cavity wherein at least one port in the plurality of ports connects the circulator to another circulator; and at least one ferrite element disposed in the internal cavity, the at least one ferrite element including at least one aperture; and the circulator module further comprising: a first control wire, wherein a first portion of the first control wire is disposed in a respective aperture of the at least one ferrite element of the first circulator and wherein a second portion of the first control wire is disposed in a respective aperture of the at least one ferrite element of the second circulator; and a second control wire, wherein a first portion of the second control wire is disposed in a respective aperture of the at least one ferrite element of the first circulator and wherein the second control wire is not disposed in a respective aperture of the at least one ferrite element of the second circulator.

Example 2 includes the circulator module of Example 1, wherein the plurality of circulators includes a third circulator and wherein a second portion of the second control wire is further disposed in a respective aperture of the at least one ferrite element of the third circulator and the first control wire is not disposed in a respective aperture of the at least one ferrite element of the third circulator.

Example 3 includes the circulator module of any of Examples 1-2, wherein the plurality of circulators includes a fourth circulator and the circulator module further comprises: a third control wire, wherein a portion of the third control wire is disposed in a respective aperture of the at least one ferrite element of the fourth circulator; and a fourth control wire, wherein a portion of the fourth control wire is disposed in a respective aperture of the at least one ferrite element of the fourth circulator.

Example 4 includes the circulator module of any of Examples 1-3, wherein one or more circulators of the plurality of circulators is coupled to a matched load that is configured to absorb reflected signals.

Example 5 includes the circulator module of any of Examples 1-4, wherein one or more circulators of the plurality of circulators further comprises a dielectric spacer.

Example 6 includes the circulator module of any of Examples 1-5, wherein the plurality of circulators comprises eight circulators.

Example 7 includes the circulator module of any of Examples 1-5, wherein the plurality of circulators comprises twelve circulators.

Example 8 includes the circulator module of any of Examples 1-7, wherein the first control wire and the second control wire are disposed in the same aperture of the at least one ferrite element of the first circulator.

Example 9 includes a ferrite circulator redundancy network comprising: a plurality of inputs; a plurality of outputs; a circulator module comprising a plurality of circulators including a first circulator and a second circulator and configured to connect the plurality of inputs to the plurality of outputs, wherein each circulator in the plurality of circulators comprises: an internal cavity; a plurality of ports extending from the internal cavity wherein at least one port in the plurality of ports connects the circulator to another circulator; and at least one ferrite element disposed in the internal cavity, the at least one ferrite element including at least one aperture; and wherein the circulator module further comprises: a first control wire, wherein a first portion of the first control wire is disposed in a respective aperture of the at least one ferrite element of the first circulator and wherein a second portion of the first control wire is disposed in a respective aperture of the at least one ferrite element of the second circulator; and a second control wire, wherein a first portion of the second control wire is disposed in a respective aperture of the at least one ferrite element of the first circulator and wherein the second control wire is not disposed in a respective aperture of the at least one ferrite element of the second circulator; the ferrite circulator redundancy network further comprising: a plurality of interconnects configured to connect the plurality of circulators to one another, wherein an interconnect connects to a port in the plurality of ports; and a circulator switch controller coupled to the first control wire and the second control wire and configured to control the direction of circulation of the plurality of circulators.

Example 10 includes the ferrite circulator redundancy network of Example 9, wherein the plurality of circulators includes a third circulator and wherein a second portion of the second control wire is further disposed in a respective aperture of the at least one ferrite element of the third circulator and the first control wire is not disposed in a respective aperture of the at least one ferrite element of the third circulator.

Example 11 includes the ferrite circulator redundancy network of any of Examples 9-10, wherein the plurality of circulators includes a fourth circulator and the circulator module further comprises: a third control wire, wherein a first portion of the third control wire is disposed in a respective aperture of the at least one ferrite element of the fourth circulator; and a fourth control wire, wherein a first portion of the fourth control wire is disposed in a respective aperture of the at least one ferrite element of the fourth circulator.

Example 12 includes the ferrite circulator redundancy network of any of Examples 9-11, wherein at least one circulator in the plurality of circulators is coupled to a matched load that is configured to absorb reflected signals.

Example 13 includes the ferrite circulator redundancy network of any of Examples 9-12, wherein at least one circulator in the plurality of circulators further comprises a dielectric spacer.

Example 14 includes the ferrite circulator redundancy network of any of Examples 9-13, wherein the plurality of circulators comprises eight circulators.

Example 15 includes the ferrite circulator redundancy network of any of Examples 9-13, wherein the plurality of circulators comprises twelve circulators.

Example 16 includes the ferrite circulator redundancy network of any of Examples 9-15, wherein the first control wire and the second control wire are disposed in the same aperture of the at least one ferrite element of the first circulator.

Example 17 includes a method for wiring a circulator module comprising: disposing a first portion of a first control wire in an aperture of a ferrite element that is included in a first circulator; disposing a second portion of the first control wire in an aperture of a ferrite element that is included in a second circulator; and disposing a first portion of a second control wire in an aperture of the ferrite element included in the first circulator, wherein a portion of the second control wire is not disposed in an aperture of the ferrite element included in the second circulator.

Example 18 includes the method of Example 17, further comprising disposing a second portion of the second control wire in an aperture of a ferrite element that is included in a third circulator.

Example 19 includes the method of any of Examples 17-18, further comprising disposing a portion of a third control wire in an aperture of a ferrite element that is included in a fourth circulator; and disposing a fourth control wire in the aperture of the ferrite element included in the fourth circulator.

Example 20 includes the method of any of Examples 17-19, further comprising coupling the first control wire and the second control wire to at least one driver, wherein the at least one driver is configured to provide a high current pulse to the first control wire or the second control wire or both.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A circulator module comprising:
   a plurality of circulators including a first circulator and a second circulator, wherein each circulator in the plurality of circulators comprises:

an internal cavity;
a plurality of ports extending from the internal cavity wherein at least one port in the plurality of ports connects the circulator to another circulator; and
at least one ferrite element disposed in the internal cavity, the at least one ferrite element including at least one aperture; and the circulator module further comprising:
a first control wire, wherein a first portion of the first control wire is disposed in a respective aperture of the at least one ferrite element of the first circulator and wherein a second portion of the first control wire is disposed in a respective aperture of the at least one ferrite element of the second circulator; and
a second control wire, wherein a first portion of the second control wire is disposed in a respective aperture of the at least one ferrite element of the first circulator and wherein the second control wire is not disposed in a respective aperture of the at least one ferrite element of the second circulator.

2. The circulator module of claim 1, wherein the plurality of circulators includes a third circulator and wherein a second portion of the second control wire is further disposed in a respective aperture of the at least one ferrite element of the third circulator and the first control wire is not disposed in a respective aperture of the at least one ferrite element of the third circulator.

3. The circulator module of claim 1, wherein the plurality of circulators includes a fourth circulator and the circulator module further comprises:
a third control wire, wherein a portion of the third control wire is disposed in a respective aperture of the at least one ferrite element of the fourth circulator; and
a fourth control wire, wherein a portion of the fourth control wire is disposed in a respective aperture of the at least one ferrite element of the fourth circulator.

4. The circulator module of claim 1, wherein one or more circulators of the plurality of circulators is coupled to a matched load that is configured to absorb reflected signals.

5. The circulator module of claim 1, wherein one or more circulators of the plurality of circulators further comprises a dielectric spacer.

6. The circulator module of claim 1, wherein the plurality of circulators comprises eight circulators.

7. The circulator module of claim 1, wherein the plurality of circulators comprises twelve circulators.

8. The circulator module of claim 1, wherein the first control wire and the second control wire are disposed in the same aperture of the at least one ferrite element of the first circulator.

9. A ferrite circulator redundancy network comprising:
a plurality of inputs;
a plurality of outputs;
a circulator module comprising a plurality of circulators including a first circulator and a second circulator and configured to connect the plurality of inputs to the plurality of outputs, wherein each circulator in the plurality of circulators comprises:
an internal cavity;
a plurality of ports extending from the internal cavity wherein at least one port in the plurality of ports connects the circulator to another circulator; and
at least one ferrite element disposed in the internal cavity, the at least one ferrite element including at least one aperture; and wherein the circulator module further comprises:
a first control wire, wherein a first portion of the first control wire is disposed in a respective aperture of the at least one ferrite element of the first circulator and wherein a second portion of the first control wire is disposed in a respective aperture of the at least one ferrite element of the second circulator; and
a second control wire, wherein a first portion of the second control wire is disposed in a respective aperture of the at least one ferrite element of the first circulator and wherein the second control wire is not disposed in a respective aperture of the at least one ferrite element of the second circulator; the ferrite circulator redundancy network further comprising:
a plurality of interconnects configured to connect the plurality of circulators to one another, wherein an interconnect connects to a port in the plurality of ports; and
a circulator switch controller coupled to the first control wire and the second control wire and configured to control the direction of circulation of the plurality of circulators.

10. The ferrite circulator redundancy network of claim 9, wherein the plurality of circulators includes a third circulator and wherein a second portion of the second control wire is further disposed in a respective aperture of the at least one ferrite element of the third circulator and the first control wire is not disposed in a respective aperture of the at least one ferrite element of the third circulator.

11. The ferrite circulator redundancy network of claim 9, wherein the plurality of circulators includes a fourth circulator and the circulator module further comprises:
a third control wire, wherein a first portion of the third control wire is disposed in a respective aperture of the at least one ferrite element of the fourth circulator; and
a fourth control wire, wherein a first portion of the fourth control wire is disposed in a respective aperture of the at least one ferrite element of the fourth circulator.

12. The ferrite circulator redundancy network of claim 9, wherein at least one circulator in the plurality of circulators is coupled to a matched load that is configured to absorb reflected signals.

13. The ferrite circulator redundancy network of claim 9, wherein at least one circulator in the plurality of circulators further comprises a dielectric spacer.

14. The ferrite circulator redundancy network of claim 9, wherein the plurality of circulators comprises eight circulators.

15. The ferrite circulator redundancy network of claim 9, wherein the plurality of circulators comprises twelve circulators.

16. The ferrite circulator redundancy network of claim 9, wherein the first control wire and the second control wire are disposed in the same aperture of the at least one ferrite element of the first circulator.

17. A method for wiring a circulator module comprising:
disposing a first portion of a first control wire in an aperture of a ferrite element that is included in a first circulator;
disposing a second portion of the first control wire in an aperture of a ferrite element that is included in a second circulator; and
disposing a first portion of a second control wire in an aperture of the ferrite element included in the first circulator, wherein a portion of the second control wire is not disposed in an aperture of the ferrite element included in the second circulator.

18. The method of claim 17, further comprising disposing a second portion of the second control wire in an aperture of a ferrite element that is included in a third circulator.

19. The method of claim 17, further comprising
disposing a portion of a third control wire in an aperture of a ferrite element that is included in a fourth circulator; and
disposing a fourth control wire in the aperture of the ferrite element included in the fourth circulator.

20. The method of claim 17, further comprising coupling the first control wire and the second control wire to at least one driver, wherein the at least one driver is configured to provide a high current pulse to the first control wire or the second control wire or both.

* * * * *